(12) United States Patent
Pickett et al.

(10) Patent No.: US 10,097,014 B2
(45) Date of Patent: Oct. 9, 2018

(54) BATTERY CHARGER MONITOR WITH CHARGE BALANCING BETWEEN BATTERIES IN A BATTERY SUPPLY

(71) Applicant: Nidec Motor Corporation, St. Louis, MO (US)

(72) Inventors: Shane A. Pickett, Fort Wayne, IN (US); William Pickering, Lyndhurst, OH (US); Bruce A. Nielsen, North Perry, OH (US); Brandon M. Bodeker, Ft. Wayne, IN (US)

(73) Assignee: Nidec Motor Corporation, St. Louis, MO (US)

( * ) Notice: Subject to any disclaimer, the term of this patent is extended or adjusted under 35 U.S.C. 154(b) by 243 days.

(21) Appl. No.: 15/172,261

(22) Filed: Jun. 3, 2016

(65) Prior Publication Data

US 2017/0353040 A1    Dec. 7, 2017

(51) Int. Cl.
| | | |
|---|---|---|
| *H02J 7/00* | (2006.01) | |
| *G01R 31/36* | (2006.01) | |
| *H01M 10/48* | (2006.01) | |
| *H01M 10/44* | (2006.01) | |

(52) U.S. Cl.
CPC ........ *H02J 7/0021* (2013.01); *G01R 31/3624* (2013.01); *H01M 10/482* (2013.01); *H02J 7/008* (2013.01); *H02J 7/0019* (2013.01); *H02J 7/0052* (2013.01); *H01M 10/441* (2013.01)

(58) Field of Classification Search
CPC ...... H02J 7/0021; H02J 7/0019; H02J 7/0072; G01R 31/3624; G01R 31/3648

USPC .......................................................... 320/112
See application file for complete search history.

(56) References Cited

U.S. PATENT DOCUMENTS

| | | | |
|---|---|---|---|
| 7,245,108 B2 | 7/2007 | Chertok et al. | |
| 8,581,547 B2 | 11/2013 | Hoff | |
| 2004/0192407 A1 | 9/2004 | Formenti | |
| 2008/0007218 A1 | 1/2008 | Veselic | |
| 2009/0160401 A1 | 6/2009 | Dishman et al. | |
| 2010/0072947 A1* | 3/2010 | Chan .................... | H02J 7/0016 320/134 |
| 2011/0068746 A1 | 3/2011 | Rocci et al. | |
| 2011/0121785 A1* | 5/2011 | Iida .................... | H01M 10/443 320/118 |
| 2012/0109556 A1 | 5/2012 | Syed et al. | |
| 2012/0161707 A1* | 6/2012 | Kim .................... | H02J 7/0016 320/118 |
| 2012/0259592 A1 | 10/2012 | Baughman | |
| 2013/0278221 A1* | 10/2013 | Maeda ................. | B60L 3/0046 320/134 |

(Continued)

*Primary Examiner* — Nathaniel Pelton
(74) *Attorney, Agent, or Firm* — Maginot Moore & Beck LLP

(57) ABSTRACT

A battery charger monitors the voltages across individual batteries in a battery system during recharging of the batteries. The charger identifies a least voltage measurement and identifies the batteries in the battery system that have a voltage measurement that is a predetermined voltage differential above the least voltage measurement. A controller in the charger operates switches to connect a resistor in parallel across each battery having a voltage measurement above the least voltage measurement by the predetermined voltage differential in a one-to-one correspondence to reduce the charge returned to the battery during recharging.

21 Claims, 2 Drawing Sheets

(56) References Cited

U.S. PATENT DOCUMENTS

| | | | |
|---|---|---|---|
| 2015/0035495 A1* | 2/2015 | Yoshida | H01M 10/425 320/134 |
| 2015/0207346 A1* | 7/2015 | Toivola | G01R 31/362 320/107 |
| 2015/0244193 A1 | 8/2015 | Wang et al. | |
| 2015/0295424 A1* | 10/2015 | Suzuki | H01M 10/441 320/116 |

* cited by examiner

BATTERY CHARGER MONITOR WITH CHARGE BALANCING BETWEEN BATTERIES IN A BATTERY SUPPLY

TECHNICAL FIELD

This disclosure relates generally to electrical battery recharging systems, and more particularly, to battery recharging systems that monitor battery charge status during recharging.

BACKGROUND

Battery systems typically include a plurality of individual batteries that are connected together to provide a single electrical power source. A "battery," as used in this document, refers to a plurality of cells that are connected in series to provide electrical power to an electrical load. Each battery within a battery system has characteristics different than the other batteries. These characteristics include energy storage capacity and discharge rates. These differences can be caused by many variables including, but not limited to, temperature, initial tolerances, material impurities, porosity, electrolyte density, surface contamination, and age. A low-capacity battery typically discharges more rapidly than a higher capacity battery. An overly discharged battery can develop poor recharging characteristics and become permanently damaged. A damaged battery can reduce the effective life of the battery system. As the capacity of a damaged battery decreases, the battery discharges through the electrical load more rapidly than a healthy battery. Eventually, the characteristics of the batteries in the system can deviate so significantly from one another that the lower capacity batteries effectively destroy the ability of the battery system to power the load for a meaningful period of time. Therefore, a need exists for a system to monitor batteries in a battery system to detect weak batteries and recharge the batteries in the system in a manner that preserves the life of the battery system.

SUMMARY

A battery charger monitors the voltage across each battery in a battery system and modifies the amount of charge returned to a battery during recharging to converge the characteristics for the batteries to predetermined range. The battery charger includes a plurality of resistors, a plurality of switches, at least one voltmeter configured to measure a voltage across each battery in a plurality of batteries, and a controller operatively connected to the plurality of switches and the current sensor. The controller is configured to receive from the voltmeter a voltage measurement for each battery in the plurality of batteries, identify a least voltage measurement, identify the batteries in the plurality of batteries that have a voltage measurement that is a predetermined voltage differential above the least voltage measurement, and operate the switches to connect one of the resistors in the plurality of resistors in parallel across each battery having a voltage measurement above the least voltage measurement by the predetermined voltage differential in a one-to-one correspondence.

A method of recharging batteries in a battery system monitors the voltage across each battery in a battery system and modifies the amount of charge returned to a battery during recharging to converge the characteristics for the batteries to predetermined range. The method includes receiving with a controller a voltage measurement for each battery in a plurality of batteries from a voltmeter configured to measure a voltage across each battery in the plurality of batteries, identify with the controller a least voltage measurement in the voltage measurements received from the voltmeter, identify with the controller the batteries in the plurality of batteries that have a voltage measurement that is a predetermined voltage differential above the least voltage measurement, and operate with the controller switches in a plurality of switches to connect resistors in a plurality of resistors in parallel across each battery having a voltage measurement above the least voltage measurement by the predetermined voltage differential in a one-to-one correspondence between resistors and batteries.

DETAILED DESCRIPTION

Figure 1:
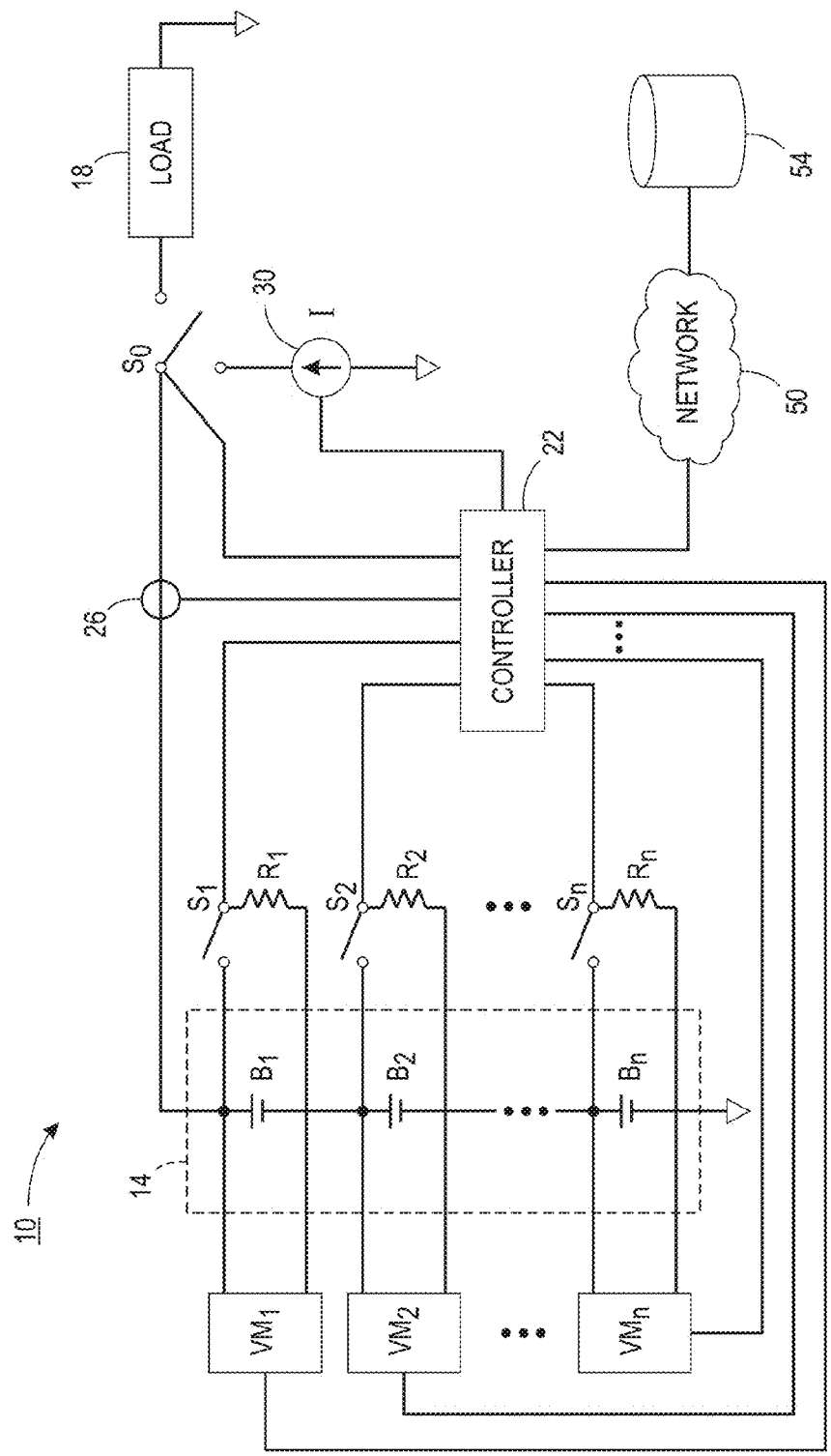
FIG. 1 is a schematic diagram of a battery system and recharger that monitors the voltage across each battery in a battery system and modifies the amount of charge returned to a battery during recharging.

FIG. 1 shows a block diagram of a battery recharger 10 that is electrically connected to a battery system 14 that can be used to power an electrical load 18. The battery system 14 includes a plurality of batteries B1, B2, . . . Bn that are connected in series to one another. The negative terminal of the last battery in the series is connected to electrical ground and the positive terminal of the first battery B1 is connected to switch S0. The battery recharger 10 includes a controller 22 that is operatively connected to voltmeters VM1, VM2, . . . VMn; switches S0, S1, S2, . . . , Sn, and current sensor 26. The controller 22 operates the switch S0 to connect the battery system 14 either to the electrical load 18 or a current source 30. The controller operates the switches S1, S2, . . . , Sn to connect a single resistor across the terminals of one battery in the battery system 14, respectively, in parallel. Controller 14 is also connected to the voltmeters to receive a signal from the voltmeters that correspond to the voltage across the output terminals of a battery in the system 14. While the system of FIG. 1 shows a voltmeter for each battery in the system 14, a single voltmeter can be connected to each battery selectively in a multiplexed fashion to provide the controller 22 with the voltages across the various batteries in the system 14. Also, while each voltmeter is depicted in FIG. 1 as having a separate input to the controller 22, the outputs of a plurality of voltmeters can be connected to a single input port on the controller that is multiplexed.

As noted previously, controller 22 operates the switch S0 to connect the battery system 14 either to the load 18 or the current source 30. When the controller operates the switch S0 to connect the battery system to the electrical load 18, the controller monitors the signal generated by the current sensor 26 that corresponds to the current being supplied to the electrical load by the battery system 14. By monitoring this load current and timing the duration of time that the current is supplied to the load, the controller can determine the charge delivered by the battery system 14 to the load in ampere-hours (amp-hours) or the like. When the controller 22 operates the switch S0 to disconnect the battery system 14 from the load 18 and to connect the battery system 14 to the current source 30, the current source 30 can supply current to the batteries in the battery system 14 to restore the charge in the batteries. In one embodiment, the controller 22 operates the current source 30 to provide a charging current that is one twentieth of the number of amp-hours that the controller determined were discharged into the electrical load, although other initial charging currents can be identified and used. Additionally, in this embodiment, the controller 22 operates the current source 30 to supply an amount of charge that corresponds to 115% of the charge supplied to the load, although other total recharge amounts can be identified and used. Thus, the controller 22 also monitors the current signal from the current sensor 26 as the batteries in the battery system 14 are being recharged and the current source 30 is disconnected from the battery system when that limitation is reached.

A recharging cycle can be divided into three phases. In the first phase, the controller operates the current source to provide as large a recharging current that the current source can supply and that the battery can handle to try to get the battery to its gassing voltage as quickly as possible. During this phase, the controller monitors the voltages across each battery and when the controller detects the battery system voltage reaching a predetermined voltage, the controller 22 begins to operate the current source 30 so the voltage remains at the predetermined voltage. This constant voltage phase is the second phase of battery recharging and during this phase, the controller 22 is reducing the current produced by the current source to keep the voltage constant. When the controller detects that the current from the source drops to a predetermined value, or that di/dt reaches some predetermined value, or a predetermined time period has expired, the controller operates the current source to output to the battery system a current having a predetermined level for the third phase of the recharging cycle. The third phase is ended by disconnecting the current source from the battery system 14 when dv/dt is less than a predetermined threshold value, the voltage across the battery system reaches a predetermined threshold, or a percentage of the amp-hours of the battery have been recharged. A typical percentage of returned amp-hours is 115%, although other percentages can be used.

During the recharging of the battery system 14, the controller monitors the voltages of the individual batteries and identifies voltage differentials in the batteries to enable charge balancing of the batteries. For charge balancing, the controller 22 identifies a least battery voltage measured by the voltmeters. Any battery having a voltage that is greater than the identified least battery voltage by a predetermined amount is selected for a charge balancing operation. In one embodiment, the predetermined amount above the least battery voltage is 40 mV, although other predetermined amounts can be used. In a charge balancing operation, the controller 22 operates the switch for any battery having a voltage that is greater than the least battery voltage by the predetermined amount. Operation of a switch S1, S2, . . . , Sn connects the corresponding resistor R1, R2, . . . , Rn in parallel across the corresponding battery B1, B2, . . . , Bn. The connecting of a resistor across a battery in this manner diverts a portion of the recharging current into the resistor rather than into the battery. These batteries receive less charge than the batteries having a voltage that is within the predetermined range above the identified least battery voltage. Because the batteries having the voltages above the least battery voltage by the predetermined amount have a smaller charge capacity than the batteries in the predetermined range above the least battery voltage, these batteries begin to approach the charge limit of the these batteries, while the remaining batteries continue to receive the full recharging current. Some energy is lost through heat dissipation in the resistors connected across the batteries, but water loss in overcharged lead acid batteries or sulfation in undercharged lead acid batteries are substantially avoided. In one embodiment, the resistors are 60 ohm resistors with a 2 watt rating. Resistors of this size and rating have an appropriate size and cost for most applications. Additionally, with a shunt current of approximately 100 milliamps, the resistors dissipate heat at about 40 degrees Celsius, which is an acceptable temperature for most applications.

Figure 2:
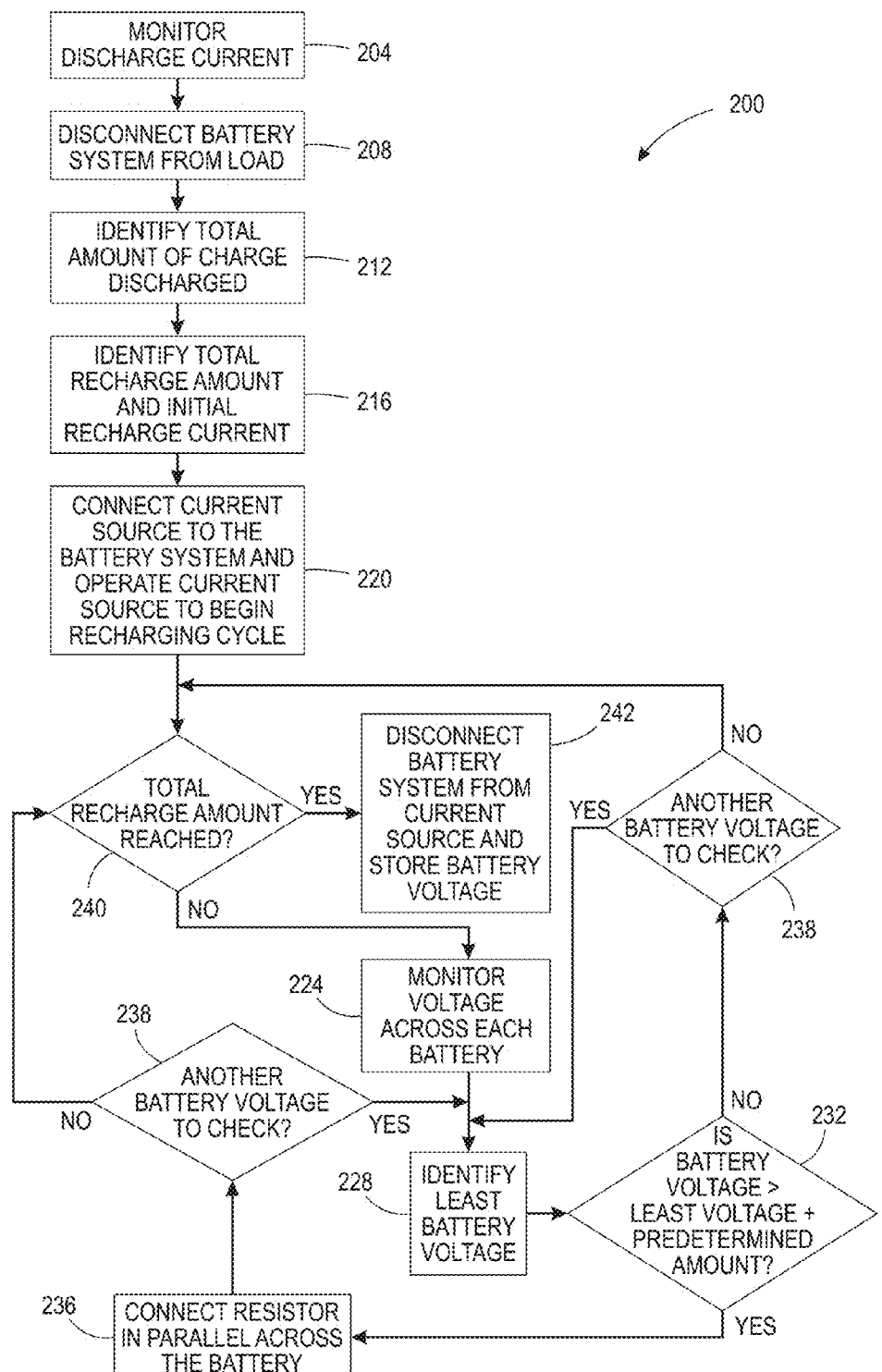
FIG. 2 is a flow diagram of a process for monitoring the voltage across each battery in a battery system and modifying the amount of charge returned to a battery during recharging.

A process of monitoring the recharging of batteries in a battery system enables charge balancing between the batteries to preserve the life of the batteries in the system. A flow diagram for one embodiment of the process 200 is shown in FIG. 2. Statements that the process is performing some task or function refers to a controller or general purpose processor executing programmed instructions stored in non-transitory computer readable storage media operatively connected to the controller or processor to manipulate data and operate one or more components in the system to perform the task or function. The controller 22 of the recharger 10 noted above can be configured with components and programmed instructions to provide a controller or processor that performs the process 200. Alternatively, the controller can be implemented with more than one processor and associated circuitry and components, each of which is configured to perform one or more tasks or functions described herein.

The process 200 begins with the monitoring of the current being supplied by the battery system to an electrical load as the battery system is being discharged (block 204). The battery system is disconnected (block 208) and a total amount discharged from the battery system is identified (block 212). As used in this system, "identification" of a quantity or parameter refers to any computational technique used with a measured value to obtain the quantity or parameter. After the total discharge amount is identified, the total recharge amount and initial recharging current are identified (block 216). The controller performing the process then connects a current source to the battery system and operates the current source with reference to the identified total recharge amount and initial recharging current (block 220). As noted previously, the total recharge amount in one embodiment is 115% of the discharged amount and the initial current is one twentieth of the total discharge amount. Voltage measurements for each battery are received from a voltmeter configured to measure a voltage across each battery in the battery system (block 224) and a least voltage measurement is identified (block 228). The batteries having a voltage measurement that is a predetermined voltage differential above the least voltage measurement are identified (block 232) and the switches corresponding to those identified batteries are operated to connect resistors in a plurality of resistors in parallel across those batteries (block 236). The process determines if another battery is to be checked for a switch operation (block 238) and, if so, the process continues through the voltages to determine whether another resistor is connected across a battery. Once all of the battery voltages have been checked, the monitoring of the battery voltages and the operation of the switches (block 224 to 236) continues until the total recharge amount is reached (block 240). When that limit is reached, the current source is disconnected from the battery system and the battery voltages at the end of the recharge cycle are stored in memory (block 242).

The battery voltages stored in the memory can be used in one or two manners during the next recharge cycle. The battery voltages are indicators of the charge capacities of the batteries. Those batteries having a voltage that is greater than the least battery voltage at the end of the recharge cycle by the predetermined amount are batteries having a smaller charge capacity than the batteries having voltages within the predetermined range about the least battery voltage. These smaller capacity batteries, however, have a voltage that is lesser than the voltages of the batteries having a greater charge capacity after the discharge cycle. Consequently, in some embodiments, these stored voltages are used for the processing described in blocks 224 to 236 of process 200 until approximately 80 percent of the recharging total amount has been reached. At that point, the smaller capacity batteries begin to have voltages greater than the batteries having the greater capacities and the real time measurements from the voltmeter(s) can be used to control the operation of the switches from that point until the end of the recharging cycle. Although the voltages can be stored in a memory operatively connected to the controller 22 at the recharging site, the voltages and other parameters can be transmitted through a network 50 (FIG. 1) to a server 54 for storage and later retrieval. Particularly, when the server 54 is operated by a third party, this type of storage is known as cloud storage. As used in this document, the term "memory operatively connected to the controller" refers to remotely located servers and the like connected to the controller over a computer communication network and includes cloud services.

In another embodiment, the controller monitors the recharging cycle until it enters the third phase defined above. When the controller detects entry into the third phase, it begins the processing described with reference to blocks 224 to 236 using actual measurements received from the voltmeter(s) to control the operation of the switches. Both approaches appear to slow down the charging of lower capacity batteries while higher capacity batteries continue to charge at higher charging currents.

Those skilled in the art will recognize that numerous modifications can be made to the specific implementations described above. Therefore, the following claims are not to be limited to the specific embodiments illustrated and described above. The claims, as originally presented and as they may be amended, encompass variations, alternatives, modifications, improvements, equivalents, and substantial equivalents of the embodiments and teachings disclosed herein, including those that are presently unforeseen or unappreciated, and that, for example, may arise from applicants/patentees and others.

What is claimed:

1. A battery charger monitor comprising:
   a plurality of resistors;
   a plurality of switches;
   at least one voltmeter configured to measure a voltage across each battery in a plurality of batteries; and
   a controller operatively connected to the plurality of switches and the at least one voltmeter, the controller being configured to:
      receive from the at least one voltmeter a voltage measurement for each battery in the plurality of batteries;
      identify a least voltage measurement in the voltage measurements received from the at least one voltmeter;
      identify the batteries in the plurality of batteries that have a voltage measurement that is greater than a predetermined voltage amount that is predetermined before receipt of the voltage measurements from the at least one voltmeter plus the least voltage measurement; and
      operate the switches to connect one of the resistors in the plurality of resistors in parallel across each battery having a voltage measurement that is greater than the least voltage measurement plus the predetermined voltage amount that is predetermined before receipt of the voltage measurements from the at least one voltmeter in a one-to-one correspondence.

2. The battery charger monitor of claim 1 further comprising:
   a current sensor configured to measure an electrical current supplied by the plurality of batteries and an electrical current supplied to the plurality of batteries; and
   the controller is further configured to identify the least voltage measurement in response to the controller detecting a recharging of the plurality of batteries has entered a finish phase.

3. The battery charger monitor of claim 2, the controller being further configured to detect entry into the finish phase in response to the voltage measurements from the at least one voltmeter indicating a predetermined voltage has been reached for all of the batteries in the plurality of batteries.

4. The battery charger monitor of claim 2, the controller being further configured to detect entry into the finish phase in response to the voltage measurements from the at least one voltmeter indicating a predetermined voltage change per unit of time has been reached for all of the batteries in the plurality of batteries.

5. The battery charger monitor of claim 2 further comprising:
   memory operatively connected to the controller; and
   the controller being further configured to detect termination of the electrical current to the plurality of batteries and to store a voltage measurement of each battery in the plurality of batteries in the memory.

6. The battery charger monitor of claim 5, the controller being further configured to identify a least voltage measurement stored in the memory and to operate the switches in the plurality of switches with reference to the voltage measurements stored in the memory to connect the resistors across the batteries having a voltage measurement that exceeds the identified least voltage measurement stored in the memory by the predetermined voltage amount that is predetermined before the voltage measurements are received from the at least one voltmeter.

7. The battery charger monitor of claim 5, the controller being further configured to identify a charge capacity of the plurality of batteries with reference to current measurements from the current sensor during discharge of the batteries and to generate a signal to cease charging of the plurality of the batteries in response to the current measurements from the current sensor indicating the charge capacity of the plurality of batteries has been exceeded by a predetermined amount during charging of the batteries.

8. A battery charger comprising:
   a plurality of resistors;
   a plurality of switches;
   at least one voltmeter configured to measure a voltage across each battery in a plurality of batteries;
   a current source configured to supply an electrical current to the plurality of batteries to recharge the batteries in the plurality of batteries; and a controller operatively connected to the plurality of switches, the current sensor, and the current source, the controller being configured to:
  receive from the at least one voltmeter a voltage measurement for each battery in the plurality of batteries;
  identify a least voltage measurement in the voltage measurements received from the at least one voltmeter;
  identify the batteries in the plurality of batteries that have a voltage measurement that is greater than a predetermined voltage amount that is predetermined before receipt of the voltage measurements from the at least one voltmeter the least voltage measurement;
  operate the switches to connect one of the resistors in the plurality of resistors in parallel across each battery having a voltage measurement that is greater than the least voltage measurement plus the predetermined voltage amount that is predetermined before receipt of the voltage measurements from the at least one voltmeter in a one-to-one correspondence; and
  operate the current source to supply the electrical current to the plurality of batteries.

9. The battery charger of claim 8 further comprising:
a current sensor configured to measure an electrical current supplied by the plurality of batteries to an electrical load and the electrical current supplied by the current source to the plurality of batteries; and
the controller is further configured to identify the least voltage measurement in response to the controller detecting a recharging of the plurality of batteries has entered a finish phase.

10. The battery charger of claim 9, the controller being further configured to detect entry into the finish phase in response to the voltage measurements from the at least one voltmeter indicating a predetermined voltage has been reached for all of the batteries in the plurality of batteries.

11. The battery charger of claim 9, the controller being further configured to detect entry into the finish phase in response to the voltage measurements from the at least one voltmeter indicating a predetermined voltage change per unit of time has been reached for all of the batteries in the plurality of batteries.

12. The battery charger of claim 9 further comprising:
memory operatively connected to the controller; and
the controller being further configured to disconnect the current source from the plurality of batteries in response to a predetermined condition being detected by the controller and to store a voltage measurement of each battery in the plurality of batteries in the memory after the controller has disconnected the current source from the plurality of batteries.

13. The battery charger of claim 12, the controller being further configured to identify a least voltage measurement stored in the memory and to operate the switches in the plurality of switches with reference to the voltage measurements stored in the memory to connect the resistors across the batteries having a voltage measurement that exceeds the identified least voltage measurement stored in the memory by the predetermined voltage amount that is predetermined before receipt of the voltage measurements from the at least one voltmeter.

14. The battery charger of claim 12, the controller being further configured to identify a charge capacity of the plurality of batteries with reference to current measurements from the current sensor during discharge of the batteries and to disconnect the current source to cease charging of the plurality of the batteries in response to the current measurements from the current sensor indicating the charge capacity of the plurality of batteries has been exceeded by a predetermined amount during charging of the batteries.

15. A method of monitoring recharging of batteries in a plurality of batteries comprising:
  receiving with a controller a voltage measurement for each battery in a plurality of batteries from a voltmeter configured to measure a voltage across each battery in the plurality of batteries;
  identify with the controller a least voltage measurement in the voltage measurements received from the voltmeter;
  identify with the controller the batteries in the plurality of batteries that have a voltage measurement that is greater than a predetermined voltage amount that is predetermined before receipt of the voltage measurements from the at least one voltmeter the least voltage measurement; and
  operate with the controller switches in a plurality of switches to connect resistors in a plurality of resistors in parallel across each battery having a voltage measurement that is greater than the least voltage measurement plus the predetermined voltage amount that is predetermined before receipt of the voltage measurements from the at least one voltmeter in a one-to-one correspondence between resistors and batteries.

16. The method of claim 15 further comprising:
detecting with the controller a recharging of the plurality of batteries has entered a finish phase of the recharging; and
identifying with the controller the least voltage measurement in response to the finish phase being detected by the controller.

17. The method of claim 16, the detection of the entry into the finish phase further comprising:
detecting with the controller that the voltage measurements from the voltmeter indicate a predetermined voltage has been reached for all of the batteries in the plurality of batteries.

18. The method of claim 16, the detection of the entry into the finish phase further comprising:
detecting with the controller that the voltage measurements from the voltmeter indicate a predetermined voltage change per unit of time has been reached for all of the batteries in the plurality of batteries.

19. The method of claim 16 further comprising:
receiving with the controller electrical current measurements from a current sensor configured to measure an electrical current supplied by the plurality of batteries to an electrical load and an electrical current supplied to the plurality of batteries from a current source;
detecting with the controller termination of the electrical current to the plurality of batteries with reference to the current measurements received from the current sensor; and
storing in a memory operatively connected to the controller a voltage measurement of each battery in the plurality of batteries received by the controller from the voltmeter.

20. The method of claim 19 further comprising:
identifying with the controller a least voltage measurement stored in the memory; and
operating with the controller the switches in the plurality of switches with reference to the voltage measurements stored in the memory to connect the resistors across the batteries having a voltage measurement that exceeds the identified least voltage measurement stored in the memory by the predetermined voltage amount that is predetermined before receipt of the voltage measurements from the at least one voltmeter.

21. The method of claim 19 further comprising:
identifying a charge capacity of the plurality of batteries with reference to current measurements from the current sensor during discharge of the batteries; and
generating a signal to cease charging of the plurality of the batteries in response to the current measurements from the current sensor indicating the charge capacity of the plurality of batteries has been exceeded by a predetermined amount during charging of the batteries.

* * * * *